（12） United States Patent
Dishop (10) Patent No.: US 7,683,718 B2
(45) Date of Patent: Mar. 23, 2010

(54) SOLID-STATE RF POWER AMPLIFIER FOR RADIO TRANSMITTERS

(76) Inventor: Steven M. Dishop, 2497 Township Road 55, Bellefontaine, OH (US) 43311-9223

( * ) Notice: Subject to any disclaimer, the term of this patent is extended or adjusted under 35 U.S.C. 154(b) by 46 days.

(21) Appl. No.: 11/749,786

(22) Filed: May 17, 2007

(65) Prior Publication Data

US 2007/0285168 A1 Dec. 13, 2007

Related U.S. Application Data

(60) Provisional application No. 60/747,662, filed on May 18, 2006, provisional application No. 60/801,006, filed on May 17, 2006.

(51) Int. Cl.
*H03F 3/26* (2006.01)
(52) U.S. Cl. .................. 330/276; 330/269; 330/275
(58) Field of Classification Search .............. 330/269, 330/275, 276, 301
See application file for complete search history.

(56) References Cited

U.S. PATENT DOCUMENTS

| 5,420,537 | A | | 5/1995 | Weedon et al. |
| 5,477,188 | A | | 12/1995 | Chawla et al. |
| 5,726,603 | A | * | 3/1998 | Chawla et al. ............. 330/276 |
| 6,046,641 | A | | 4/2000 | Chawla et al. |
| 6,157,258 | A | | 12/2000 | Adishian et al. |
| 6,496,069 | B1 | * | 12/2002 | Van De Westerlo ......... 330/276 |

OTHER PUBLICATIONS

Blocksome, HF Radio Systems & Circuits, 1998; pp. 458-479, 498-511, Noble Publishing Corporation, Atlanta, GA; USA.
Granberg, AN593, "Broadband Linear Power Amplifiers: Using Push-Pull Transistors," RF Application Reports, 1993; Motorola Literature Distribution, Phoenix, AZ; USA.
Granberg, AN749, "Broadband Transformers & Power Combining Techniques for RF," RF Application Reports, 1993; Motorola Literature Distribution, Phoenix, AZ; USA.
Granberg, AN 758, "A Two-Stage 1kW Sold State Linear Amplifier," RF Application Reports, 1994; Motorola Literature Distribution, Phoenix, AZ; USA.

(Continued)

*Primary Examiner*—Khanh V Nguyen
(74) *Attorney, Agent, or Firm*—Pearne & Gordon LLP (57) ABSTRACT

An RF power amplifier includes first and second field effect transistors having a gate, a source, and a drain, having an output power rating of at least 200 watts, and operating with a drain-to-source voltage that is greater than 50 VDC. The transistors are configured as a push-pull amplifier. The amplifier further includes an RF signal input. A input transformer is connected to the RF signal input. The input transformer has respective balanced outputs connected to the gates of the transistors. A broadband output transformer has a first balanced input connected to the drain of one the transistors, and a second balanced input connected to the drain of the other transistor. The broadband output transformer has an input to output impedance ratio of 1:4.

39 Claims, 3 Drawing Sheets

OTHER PUBLICATIONS

Granberg, AN762, "Linear Amplifiers for Mobile Operation," RF Application Reports, Jun. 1984; Motorola Literature Distribution, Phoenix, AZ; USA.

Granberg, AR176, "New MOSFETs Simplify High Power RF Amplifier Design," RF Application Reports, 1995; pp. 412-417, Motorola Literature Distribution, Phoenix, AZ; USA.

Granberg, AR313, "Wideband RF Power Amplifier," RF Application Reports, Apr. 1991; Motorola Literature Distribution, Phoenix, AZ; USA.

Granberg, AR347, "A Compact 1-kw 2-50 MHz Solid-State Linear Amplifier," RF Application Reports, Dec. 1991; Motorola Literature Distribution, Phoenix, AZ; USA.

Granberg, AR580, "MOSFET RF Power: An update," QST Magazine, Jan. 1983; pp. 13-16, 30-33, vol. 67, No. 1, American Radio Relay League, Inc., Newington, CT; USA.

Granberg, EB104, "Get 600 Watts RF from Four Power FET's," Engineering Bulletin, Sep. 1993; Motorola Literature Distribution, Phoenix, AZ; USA.

Granberg, AR305, "Building Push-Pull, Multioctave, VHF Power Amplifiers," 1987, Motorola Semiconductor Products Inc., Phoenix, AZ; USA.

* cited by examiner

SOLID-STATE RF POWER AMPLIFIER FOR RADIO TRANSMITTERS

CROSS-REFERENCE TO RELATED APPLICATIONS

Benefit of U.S. Provisional Patent Application Ser. No. 60/801,006, filed May 17, 2006 is hereby claimed and the disclosure incorporated herein by reference. Benefit of U.S. Provisional Patent Application Ser. No. 60/747,662, filed May 18, 2006 is hereby claimed and the disclosure incorporated herein by reference.

BACKGROUND OF THE INVENTION

1. Field of the Invention

The present invention relates to power amplifiers, and more particularly to radio frequency (RF) power amplifiers employing high voltage and high power metal-oxide semiconductor field-effect transistors (MOSFET).

2. Description of Related Art

High-power RF amplifiers adapted to operate over a range of 1-60 MHz without tuning have typically employed vacuum tubes. It would be desirable to provide a high-power RF amplifier for operation over a range of 1-60 MHz, and which employs a minimum number of MOSFET transistors instead of vacuum tubes.

BRIEF SUMMARY OF THE INVENTION

In accordance with one aspect of the invention, provided is an RF power amplifier including a first field effect transistor having a first gate, a first source, and a first drain, having an output power rating of at least 200 watts, and operating with a drain-to-source voltage that is greater than 50 VDC. The amplifier includes a second field effect transistor having a second gate, a second source, and a second drain, having an output power rating of at least 200 watts, and operating with a drain-to-source voltage that is greater than 50 VDC. The transistors are configured as a push-pull amplifier. The amplifier further includes an RF signal input. An input transformer is connected to the RF signal input. The input transformer has respective balanced outputs connected to the first gate and the second gate. A broadband output transformer has a first balanced input connected to the first drain, and a second balanced input connected to the second drain. The broadband output transformer has an input to output impedance ratio of 1:4.

An RF power amplifier includes a first plurality of field effect transistors having directly interconnected drains and respective output power ratings of at least 100 watts, and a second plurality of field effect transistors having directly interconnected drains and respective output power ratings of at least 100 watts. The transistors operate with a drain-to-source voltage that is greater than 50 VDC. The first plurality of field effect transistors and the second plurality of field effect transistors together form a push-pull amplifier having an output power rating of at least 400 watts. The amplifier further includes an RF signal input. An input transformer is connected to the RF signal input. The input transformer has respective balanced outputs connected to the gates of the transistors. A broadband output transformer has a first balanced input connected to the drains of the first plurality of field effect transistors, and a second balanced input connected to the drains of the second plurality of field effect transistors. The broadband output transformer has an input to output impedance ratio of 1:4.

DETAILED DESCRIPTION OF THE INVENTION

As used herein, the terms "connected" and "connected to" refer a physical and/or electrical joining or linking of one thing to another, and includes direct and indirect connections. For example, an amplifier can be connected to an RF signal input by direct electrical connection between the amplifier and input, or connected to said input via an indirect electrical connection, such as through an interposing resistor or capacitor. In the former case, the amplifier is directly connected to the input. In the latter case, the amplifier is indirectly connected to the input. However, in both cases, the amplifier is connected to the RF input.

Figure 1:
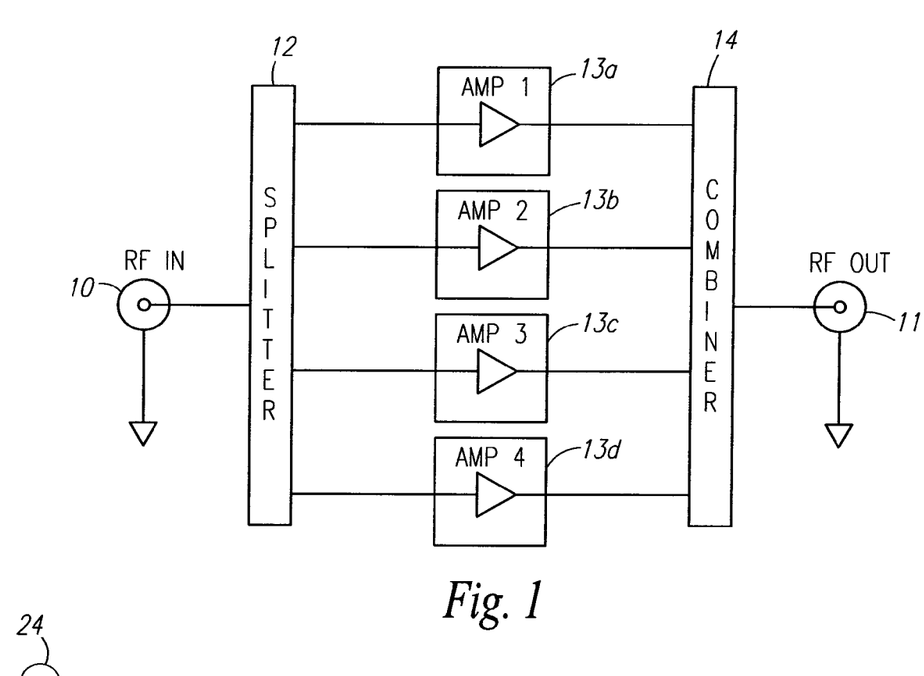
FIG. 1 is a top-level schematic block diagram of a modular RF power amplifier system.

FIG. 1 shows a top level schematic block diagram of a modular RF power amplifier system. The amplifier system includes an RF input terminal 10 and an RF output terminal 11. In an embodiment, the characteristic impedance of the input and output terminals is 50 ohms. The terminals 10, 11 can be adapted for use with removable connectors. For example, the terminals 10, 11 can include a BNC or SMA female connector for removably connecting to a BNC or SMA male connector, respectively.

An RF signal to be amplified by the amplifier system is provided at the RF input terminal 10. The RF signal is split by splitter 12 into separate signals to be amplified by a number of power amplifier modules 13a-13d. In the example of FIG. 1, four power amplifier modules 13a-13d are provided. Therefore, the splitter 12 splits the RF signal into four separate signals. It is to be appreciated that fewer than four power amplifier modules could be provided, such as two or three amplifier modules, for example. It is to be further appreciated that greater than four power amplifier modules could be provided, such as six or eight amplifier modules, for example. The splitter 12 is designed to split the RF input signal into as may separate signals as there are power amplifier modules. The splitter 12 can include a cascade of separate splitters for staged splitting of the RF input signal into a number of separate signals.

The power amplifier modules 13a-13d amplify the separate signals from the splitter 12 according to the power ratings of the amplifier modules 13a-13d. In an embodiment, each power amplifier module 13a-13d has a power rating of 400 watts. A modular RF power amplifier system employing four 400 watt power amplifier modules would provide approximately 1600 watts of total amplification. In another embodiment, each power amplifier module 13a-13d has a power rating of 600 watts. A modular RF power amplifier system employing four 600 watt power amplifiers would provide approximately 2400 watts of total amplification. In still another embodiment, each power amplifier module 13a-13d has a power rating of 1200 watts. A modular RF power amplifier system employing four 1200 watt power amplifiers would provide approximately 4800 watts of total amplification. In still another embodiment, each power amplifier module 13a-13d has a power rating of 1500 watts. A modular RF power amplifier system employing four 1500 watt power amplifies would provide approximately 6000 watts of total amplification. As discussed above, fewer than four power amplifier modules could be provided or greater than four power amplifier modules could be provided. The number of power amplifier modules to be used and their power ratings can be chosen based on the required power output.

Figure 2:
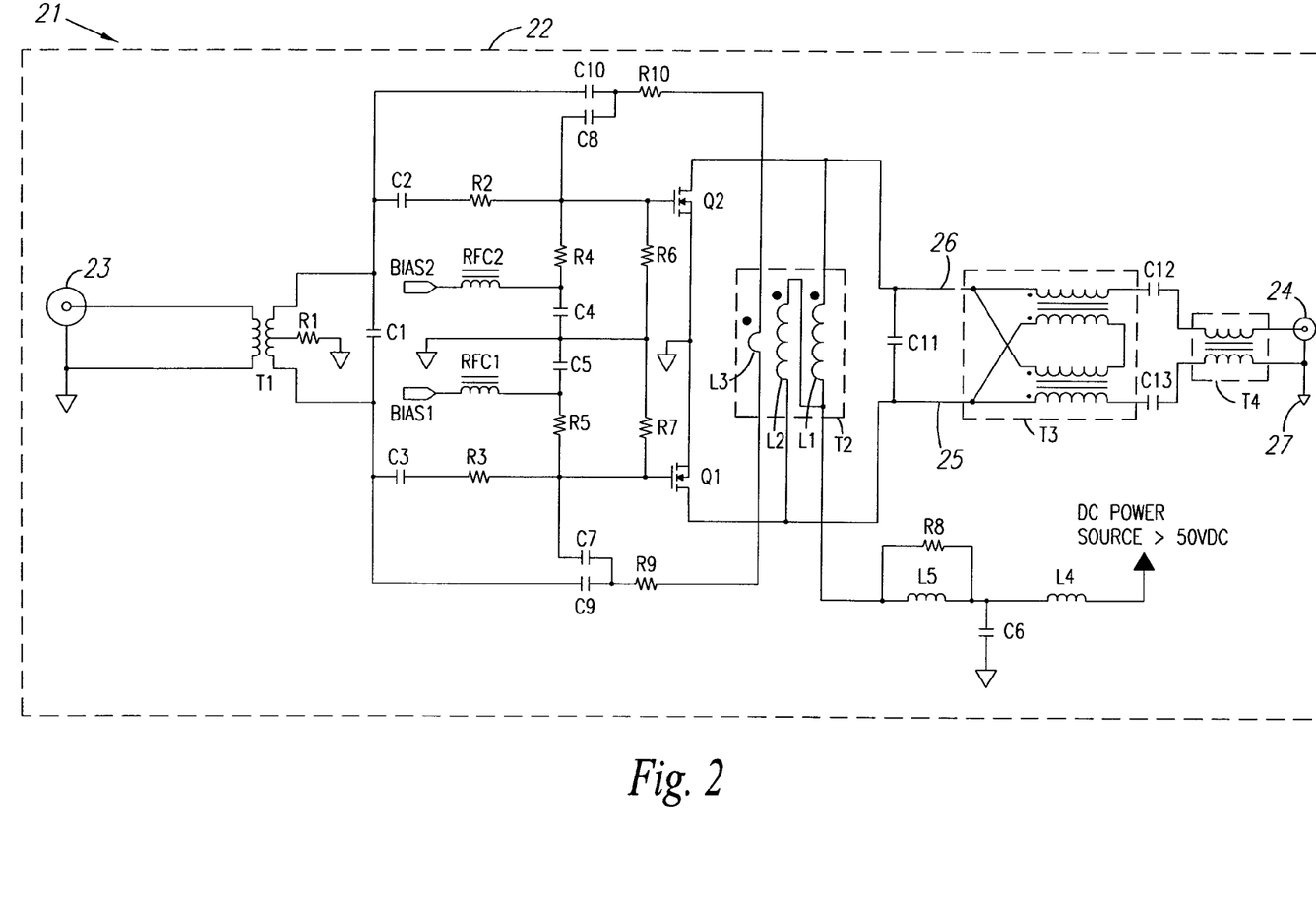
FIG. 2 is a schematic circuit diagram of an RF power amplifier module.
Figure 3:
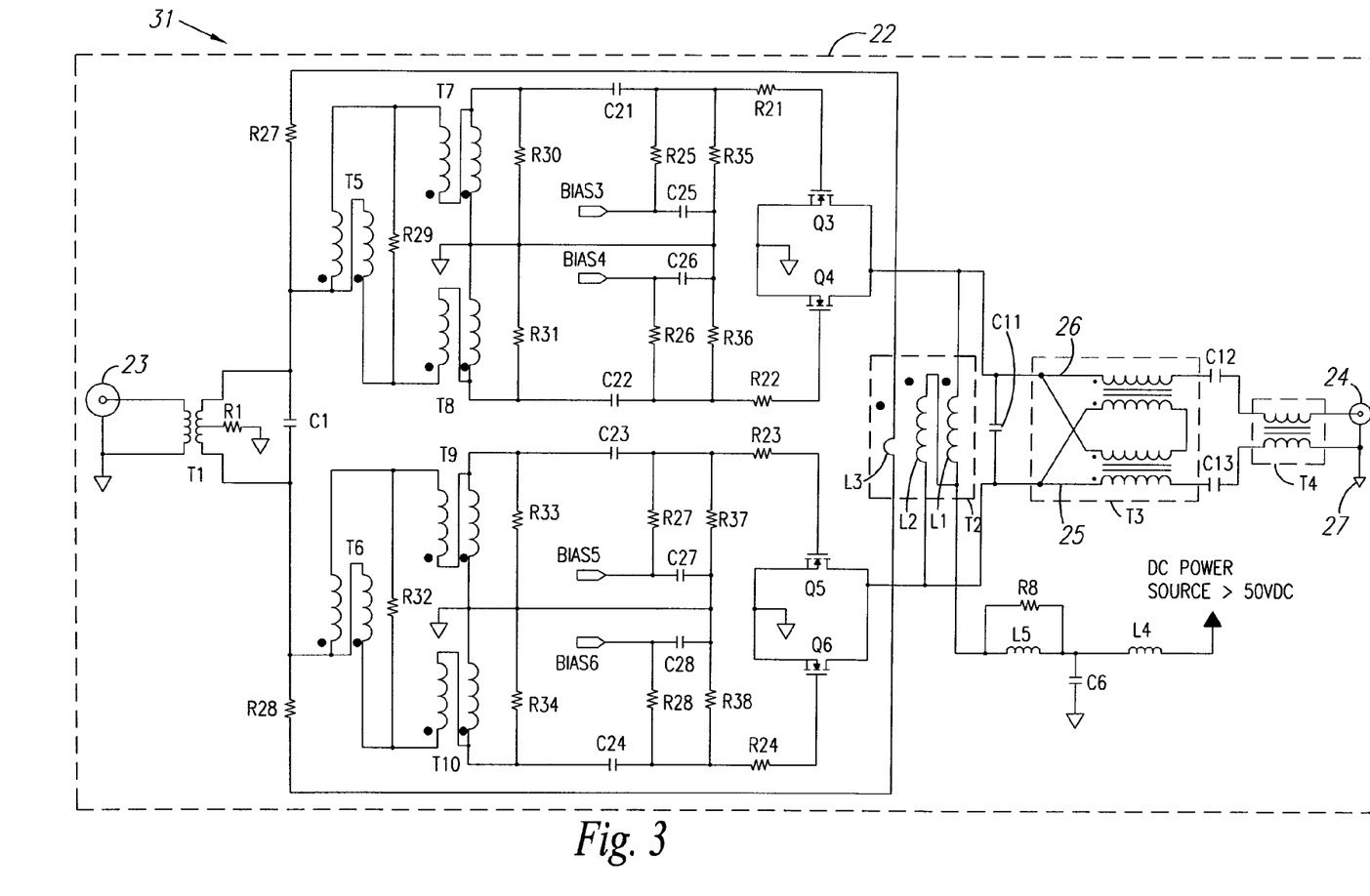
FIG. 3 is a schematic circuit diagram of an RF power amplifier module.

Example power amplifier modules 13a-13d are shown in FIGS. 2 and 3 and are discussed in detail below. In an embodiment, each power amplifier module 13a-13d is provided on a separate printed circuit board. In other embodiments, a plurality of amplifier modules are provided on one or more printed circuit boards.

Outputs from each of the power amplifier modules 13a-13d are provided to a combiner 14. In the example of FIG. 1, four power amplifier modules 13a-13d are provided and the combiner 14 combines the four outputs from the amplifier modules into a single, combined RF output. The combiner 14 is designed to combine as many signals as there are power amplifier modules. The combiner 14 can include a cascade of separate combiners for staged combining of the amplified signals into a combined signal. As shown in FIG. 1, the RF output from the combiner 14 is provided to the RF output terminal 11.

An RF power amplifier could comprise a single amplifier module, rather than a plurality of modules 13a-13d as shown in FIG. 1. An RF power amplifier having a single amplifier module would not require the splitter 12 and combiner 14.

FIG. 2 shows a push-pull power amplifier module 21. Transistors Q1 and Q2 form a push-pull pair for amplifying an RF signal.

The components that form the amplifier module 21 can be mounted on a printed circuit board 22. The amplifier module includes an RF input terminal 23 and an RF output terminal 24. In an embodiment, the characteristic impedance of the module's input and output terminals is 50 ohms. The terminals 23, 24 can be adapted for use with removable connectors, such as BNC or SMA connectors, for example.

An RF signal to be amplified by the amplifier module 21 is provided at the RF input terminal 23. The RF signal is transmitted to an input transformer T1. The transformer T1 has an unbalanced or single-ended side, which is connected to the RF input terminal 23. The unbalanced or single-ended side is coupled to a balanced or differential side of the transformer T1. The transformer T1 is shown as a so-called conventional transformer, having separated primary and secondary windings. It is to be appreciated that the transformer T1 could be constructed as a transmission line transformer, which does not have separated primary and secondary windings. An optional ground reference is provided for the transformer's balanced or differential side via a resistor R1. The transformer T1 has an input to output impedance ratio of 4:1, for example, and serves to divide the unbalanced RF signal into balanced signals, 180° out of phase, for amplification by the push-pull transistor pair Q1, Q2, and subsequent combination. It is to be appreciated that the transformer T1 could have an input to output impedance ratio of other than 4:1, such as 1:1.414, 1:9, 1:25, 3:2, etc. Further, it is to be appreciated that a so-called pi attenuator or pi input attenuator (not shown) comprising a plurality of resistors in a Greek letter "pi" configuration could be provided between the RF input terminal 23 and the transformer Ti, for normalizing gain of the amplifier module 21. Other attenuators could be provided between the RF input terminal 23 and the transformer T1, such as an L attenuator or a T attenuator, for example.

The input transformer T1 is shown as an unbalanced-to-balanced transformer. However, it is to be appreciated that T1 could alternatively be a balanced-to-balanced transformer.

An optional compensation capacitor C1 is connected across the balanced terminals of the transformer T1 and provides a low-pass filter response which absorbs the inductance of T1 and helps compensate for a loss of gain at higher frequencies.

The transistors Q1, Q2 that form the push-pull pair are high-voltage MOSFET RF power transistors. The transistors Q1, Q2 have output power ratings of at least 150 watts, preferably at least 200 watts, and operate with a drain-to-source voltage that is greater than 50 VDC, such as 62 VDC, 72 VDC, 86 VDC, 96 VDC or 100 VDC, for example. Example transistors Q1, Q2 have output power ratings of 150 watts, 300 watts, and 750 watts. An example 150 watt transistor is model ARF520 manufactured by ADVANCED POWER TECHNOLOGY®. A further example 150 watt transistor is model SD3931 manufactured by STMICROELECTRONICS®. An example 300 watt transistor is model SD3933 manufactured by STMICROELECTRONICS®. An example 750 watt transistor is model ARF1500 manufactured by ADVANCED POWER TECHNOLOGY®. It is to be appreciated that transistors having output power ratings other than 150 watts, 300 watts, and 750 watts can be used in an amplifier module as shown in FIG. 2. For example, 200 watt transistors can be used in the amplifier module.

An amplifier module 21 as shown in FIG. 2, having 150 watt transistors Q1, Q2 forming a push-pull pair, can have a power rating of 300 watts. An amplifier module 21 having 300 watt transistors Q1, Q2 forming a push-pull pair, can have a power rating of 600 watts. An amplifier module 21 having 750 watt transistors Q1, Q2 forming a push-pull pair, can have a power rating of 1500 watts. It is to be appreciated that the power rating of the amplifier module depends on the power rating of the selected transistors and the drain-to-source voltage at which the transistors are operated. Further, it is to be appreciated that amplifier modules of various power ratings can be constructed.

The balanced signals from the transformer T1 are respectively provided to the gates of the transistors Q1, Q2. One balanced signal is provided to the gate of transistor Q2 through a coupling capacitor C2 and a resistor R2, for amplification by the transistor Q2. The other balanced signal is provided to the gate of transistor Q1 through a coupling capacitor C3 and resistor R3, for amplification by the transistor Q1. In an embodiment, capacitors C2 and C3 are each formed by two paralleled 47 nF capacitors and resistors R2 and R3 are each formed by four paralleled 15 ohm resistors.

A DC bias voltage for the gate of transistor Q2 is provided at BIAS2. The bias voltage is provided to the gate of transistor Q2 through an RF choke RFC2 and resistor R4. A capacitor C4 is connected to the RF choke RFC2 and resistor R4, and also to ground, and provides a low impedance path to ground for high frequency signals. In an embodiment, the RF choke RFC2 has a value of 10 μH. The DC bias voltage for the gate of transistor Q2 can be provided by a temperature compensating bias circuit.

Similarly, a DC bias voltage for the gate of transistor Q1 is provided at BIAS1. The DC bias voltage BIAS1 is provided to the gate of transistor Q1 through an RF choke RFC1 and resistor R5. A capacitor C5 is connected to the RF choke RFC1 and resistor R5, and also to ground. The capacitor C5 provides a low impedance path to ground for high frequency signals. In an embodiment, the RF choke RFC1 has a value of 10 μH. The DC bias voltage for the gate of transistor Q1 can be provided by a temperature compensating bias circuit.

In an embodiment, capacitors C4 and C5 are each formed by two paralleled 47 nF capacitors and resistors R4 and R5 are each formed by four paralleled 110 ohm resistors.

The gates of the transistors Q1, Q2 are respectively connected to ground through resistors R7 and R6, which provide a discharge path for the charge on the gates when DC bias is removed, and provide a solid ground reference for the DC bias voltages for the gates. The respective sources of transistors Q1 and Q2 are directly connected to ground. In an embodiment, resistors R6 and R7 each have a value of 10 kΩ.

As shown in FIG. 2, a DC power source that is greater than 50 VDC is connected to the drain of each transistor Q1, Q2 through a common mode choke T2. Coils L1 and L2 of the common mode choke T2 are connected such that magnetic flux is cancelled during each RF cycle, to minimize the net flux inside of the choke and, therefore, minimize the size of its core. A coil L3, which is an additional winding of the common mode choke, provides a negative feedback signal from the DC feed structure. Coil L3 can be provided by a single turn through the center of the core of the common mode choke T2. Negative feedback serves to lower the input impedance and to stabilize the amplifier's gain over its frequency range. A feedback path for the gate of transistor Q1 is provided through a network that includes resistor R9 and either capacitor C7 or optionally capacitor C9. A feedback path for the gate of transistor Q2 is provided through a network that includes resistor R10 and either capacitor C8 or optionally capacitor C10. In an embodiment, capacitors C7 and C8 are each formed by two paralleled 47 nF capacitors while capacitors C9 and C10 are not used, and resistors R9 and R10 are each formed by four paralleled 36 ohm resistors.

It is to be appreciated that coil L3 may be omitted and that negative feedback may be taken directly from the drains of the transistors Q1 and Q2. In such a configuration, the feedback resistors R9 and R10 will be made physically larger because the voltage at the drains is proportionally larger by the winding ratio of coil L3 to T2. More specifically, the voltage from coil L3 is proportional to the ratio of L3 turns divided by the sum of the turns of coils L1 and L2 times the RF drain-to-drain voltage applied to the primary low impedance side of transformer T3 (transformer T3 is discussed in detail below). For example if coil L3 is one turn and L1 and L2 are each eight turns, the voltage available from L3 is 1/16th of the drain-to-drain RF voltage.

The DC power source is connected to the common mode choke T2 through a network that includes inductors L4 and L5, a capacitor C6 and a resistor R8. The inductors L5 and L6 provide a high impedance to RF signals and a short circuit for the DC power source. RF signals are decoupled from the DC power source by conduction to ground through the resistor R8 and the capacitor C6. Inductors L4 and L5 can be ferrite bead inductors. In an embodiment, inductor L5 is a wound ferrite core with a value of 10 µH, and capacitor C6 is formed by six paralleled 47 nF capacitors. In addition to capacitor C6, similar grounded capacitors can be provided between inductor L4 and the DC power source, and between inductor L5 and the common mode choke T2. If, in addition to capacitor C6, similar grounded capacitors are provided between inductor L5 and common mode choke T2, then resistor R8 can be omitted. Sometimes, in an effort to increase isolation between the drains, the common DC feed point terminal of the common mode choke T2 is split, and each winding is fed by identical decoupling networks similar to inductor L5, resistor R8, capacitor C6, and inductor L4. In such a configuration, the resistors need to be twice the value of resistor R8 because they are AC paralleled. If in addition to capacitor C6 similar grounded capacitors are used at the DC feed terminals of the common mode choke T2, the resistors can be omitted.

A broadband transmission line output transformer T3 is connected to the drain of each transistor Q1, Q2 and combines the amplified RF signals from each transistor Q1, Q2. The transformer T3 is a balanced-to-balanced transformer having respective balanced inputs 25, 26 connected to the drains of the transistors Q1, Q2. In FIG. 2, balanced input 25 is directly connected to the drain of transistor Q1, and balanced input 26 is directly connected to the drain of transistor Q2. However, it is to be appreciated that DC-blocking capacitors could be provided between the balanced inputs 25, 26 and the drains of the transistors Q1, Q2. The transformer T3 has an input to output impedance ratio of 1:4 and performs an impedance matching function. In an embodiment, the characteristic impedance of the transistor output circuitry is 12.5 ohms. The transformer T3 combines the outputs from the transistors Q1, Q2 and steps the characteristic impedance of the circuit up to 50 ohms.

Transformer T3 can be constructed using suitable cores, for example, toroid or ferrite tube cores, and coaxial cables having a characteristic impedance of approximately or exactly 25 ohms. Each coaxial cable can be wound on its own core. 25 ohms is the geometric mean of a 12.5 ohm input and a 50 ohm output. Performance of the transformer T3 is enhanced when the characteristic impedance of the transformer's cables is the geometric mean of the input and output impedances. In an embodiment, the transformer T3 includes coaxial cables having a characteristic impedance of 25 ohms, a size 16 AWG stranded center conductor, TEFLON® insulation between an outer braid and the center conductor, and an insulating jacket. The 25 ohm transmission line used to construct the transformer T3 can also be constructed by paralleling standard 50 ohm coaxial cable. Further, the transmission line used to construct the transformer T3 may be constructed from parallel magnet wire or parallel twisted TEFLON®-insulated wire.

As stated above, the transformer T3 is a balanced-to-balanced transformer. There is essentially zero net flux within the cores of the transformer T3 because the currents in its transmission lines travel in opposite directions, which gives rise to identical fluxes of opposite sense. It is to be appreciated that in a balanced-to-unbalanced or unbalanced-to-unbalanced transformer, the flux cancellation is not as complete. Therefore, the cores of the transformer T3 can be made smaller than those used in a balanced-to-unbalanced or unbalanced-to-unbalanced transformer. Smaller transformer cores allow for shorter windings, thereby increasing the high frequency response of the transformer T3. Also, smaller transformer cores can accommodate a greater number or windings, resulting in increased inductance, which extends the lower frequency range of the transformer, such as to 1 MHz for example. In an embodiment, transformer T3 has an operating frequency range of 1-60 MHz.

One benefit of using a 1:4 impedance ratio transmission line transformer as an RF output transformer, as shown in FIG. 2, is that such a transformer is less difficult to construct than other transformers. A transformer having a 1:4 impedance ratio has an integer turns ratio of 1:2 and, therefore, does not require a winding tap. Such a transformer is less difficult to construct than a transformer having an impedance ratio of 1:2, which has a non-integer turns ratio of 1:1.414. However, in order to utilize a 1:4 impedance ratio transformer as an RF output transformer in a 600 watt push-pull amplifier module, transistors that operate with a drain-to-source voltage that is greater than 50 VDC must be used, rather than conventional 50 VDC MOSFETs.

An optional compensation capacitor C11 is connected across the balanced input terminals 25, 26 of the transformer T3, and provides a low-pass filter response by absorbing the inductance of T3 and any output capacitance of the transistors Q1, Q2. This helps compensate for gain slope reduction at the high end of the amplifier module's frequency range.

The balanced outputs of transformer T3 are connected to an optional output balun transformer T4 through DC-blocking capacitors C12, C13. Capacitor C12 is connected between one output of transformer T3 and one input of balun transformer T4. Capacitor C13 is connected between the other output of transformer T3 and the other input of balun transformer T4. The capacitors C12, C13 and balun transformer T4 are connected in series between transformer T3 and the RF output terminal 24. In the embodiment of FIG. 2, the capacitors C12, C13 are located at the output, 50 ohms side of transformer T3, and between transformer T3 and balun transformer T4. By locating the DC-blocking capacitors at the output, 50 ohms side of transformer T3, rather than at the input side, the capacitors C12, C13 can be designed to handle a lower current. Such capacitors may be less expensive than capacitors designed to handle a higher current. The optional output balun transformer T4 has an impedance ratio of 1:1 and is connected to RF output terminal 24. In an embodiment, the output balun transformer T4 is constructed using 50 ohm coaxial cable and a ferrite core. Alternatively, transformer T4 may be formed by paralleled magnet wire or by parallel or twisted TEFLON®-insulated wire. By locating the DC-blocking capacitors C12, C13 between transformers T3 and T4, the RF output terminal 24 can be directly connected to the output balun transformer T4 and installed directly on a ground plane 27 of the printed circuit board 22. It is to be appreciated that the output balun transformer T4 is optional and can be omitted in some applications. However, omitting the output balun transformer T4 may result in reduced efficiency and/or increased intermodulation distortion (IMD).

Figure 2A:
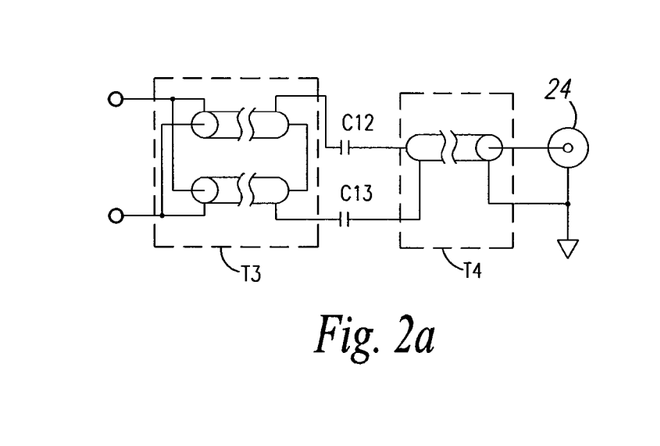
FIG. 2a is a schematic circuit diagram of a portion of FIG. 2.

A further schematic view of the broadband output transformer T3, the DC-blocking capacitors C12, C13, and the output balun transformer T4 is provided at FIG. 2a. In FIG. 2a, the broadband output transformer T3 and output balun transformer T4 are schematically shown as comprising coaxial cables. The output balun transformer T4 is shown having a coaxial cable shield connected to ground and a coaxial cable center conductor connected to the RF output terminal 24. It is to be appreciated that the output balun transformer T4 can be reversely connected, so that the coaxial cable shield is connected to the RF output terminal 24 and the coaxial cable center conductor connected to ground. The high impedance output side of the broadband output transformer T3 is connected the output balun transformer T4 through the DC-blocking capacitors C12, C13. In FIG. 2a, at the high impedance output side of transformer T3, the coaxial cable center conductors are shown as directly connected together, and the coaxial cable shields are connected to respective DC-blocking capacitors C12, C13. It is to be appreciated that the high impedance output side of transformer T3 can be reversely connected, so that its coaxial cable shields are directly connected together, and the coaxial cable center conductors are connected to respective DC-blocking capacitors C12, C13.

In an embodiment, capacitors C12 and C13 are each formed by six paralleled 47 nF capacitors.

FIG. 3 shows another embodiment of a push-pull amplifier module 31. Various components shown in FIG. 3 are discussed above with respect to FIG. 2. Such components are referenced in FIG. 3 by identical character references as used in FIG. 2 and are not discussed in detail below.

A plurality of transistors having grounded sources and directly interconnected drains form each half of the push-pull amplifier. For example, two transistors Q3, Q4 form the "push" half of the amplifier and two transistors Q5, Q6 form the "pull" half of the amplifier. The transistors Q3-Q6 can have output power ratings of at least 100 watts and operate with a drain-to-source voltage that is greater than 50 VDC. An example 100 watt transistor is model ARF463 manufactured by ADVANCED POWER TECHNOLOGY®. An amplifier module 31, having four 100W transistors Q3-Q6 can have a power rating of 400W. An amplifier module 31 having four 150 watt transistors Q3-Q6 can have a power rating of 600 watts. An amplifier module 31 having four 300 watt transistors Q3-Q6 can have a power rating of 1200 watts. In additional embodiments, each half of the push-pull amplifier includes more than two transistors. It is to be appreciated that amplifier modules of various power ratings can be constructed, based on the power rating of the selected transistors, the drain-to-source voltage at which the transistors are operated, and the number of transistors provided in each half of the push-pull amplifier.

An RF signal to be amplified by the amplifier module 31 is provided at the RF input terminal 23. The RF signal is transmitted to the transformer T1 and split into balanced RF signals at the output of transformer T1.

The balanced RF signals from transformer T1 are respectively provided to transformers T5 and T6. Transformers T5 and T6 are so-called Type 1 Splitters, which further split the RF signals. The respective split signals from transformer T5 are provided to transformers T7 and T8, which are impedance matching transformers having an input-to-output impedance ratio of, for example, 1:4. The RF signal that is output from impedance matching transformer T7 is provided to the gate of transistor Q3 through DC-blocking capacitor C21 and resistor R21. Similarly, the RF signal that is output from impedance matching transformer T8 is provided to the gate of transistor Q4 through DC-blocking capacitor C22 and resistor R22. In an embodiment, the DC-blocking capacitors C21 and C22 are each formed by two paralleled 47 nF capacitors.

The respective split signals from transformer T6 are provided to impedance matching transformers T9 and T10. The RF signal that is output from impedance matching transformer T9 is provided to the gate of transistor Q5 through DC-blocking capacitor C23 and resistor R23. Similarly, the RF signal that is output from impedance matching transformer T10 is provided to the gate of transistor 06 through DC-blocking capacitor C24 and resistor R24. In an embodiment, the DC-blocking capacitors C23 and C24 are each formed by two paralleled 47 nF capacitors.

It is to be appreciated that a splitter utilizing resistors for further splitting the RF signals from transformer T1 could be used, rather than a Type 1 Splitter and impedance matching transformers as shown in FIG. 3.

A DC bias voltage for the gate of transistor Q3 is provided at BIAS3 and through a resistor R25, for example, a 15 Ω resistor. A capacitor C25, for example, a 47 nF capacitor, provides a low impedance path to ground for high frequency signals. A DC bias voltage for the gate of transistor Q4 is provided at BIAS4 and through a resistor R26, for example, a 15 Ω resistor. A capacitor C26, for example, a 47 nF capacitor, provides a low impedance path to ground for high frequency signals. A DC bias voltage for the gate of transistor Q5 is provided at BIAS5 and through a resistor R27, for example, a 15 Ω resistor. A capacitor C27, for example, a 47 nF capacitor, provides a low impedance path to ground for high frequency signals. A DC bias voltage for the gate of transistor Q6 is provided at BIAS6 and through a resistor R28, for example, a 15 Ω resistor. A capacitor C28, for example, a 47 nF capacitor, provides a low impedance path to ground for high frequency signals.

Feedback signals are provided from the common mode choke T2 via coil L3 through resistors R27 and R28. It is to be appreciated that negative feedback could be taken directly from the drains of the transistors Q3-Q6, which would require physically larger dissipation resistors R27, R28. In an embodiment, resistors R27 and R28 are each formed by two paralleled 430 ohm resistors.

Resistors R29-R34 are balancing resistors for absorbing amplitude imbalance between the signal splitter outputs due to production tolerances. The resistors R29-R34 also help to maintain correct input port impedance, contributing to a low voltage standing wave ratio (VSWR). In an embodiment, resistors R29 and R32 are each formed by two paralleled 51 ohm resistors, and resistors R30, R31, R33, and R34 are each formed by two paralleled 15 ohm resistors.

Resistors R35-R38 provide discharge paths for the charge on the gates when DC bias is removed, and provide solid ground references for the DC bias voltages for the gates. In an embodiment, resistors R35-R38 each have a value of 10 k$\Omega$.

The drains of transistors Q3 and Q4 are interconnected or directly connected together and are directly connected to an input 26 of transformer T3. The drains of transistors Q5 and Q6 are also interconnected or directly connected together and are directly connected to an input 25 of transformer T3. The "push" signal from transistors Q3 and Q4 are combined with the "pull" signal from transistors Q5 and Q6 by transformer T3.

Example applications with which the disclosed modular RF power amplifier system may be used include radio communications, such as amateur radio communications, military radio communications, marine radio communications (e.g., ship to shore), high frequency radio telephone communications, and short wave radio broadcast stations.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An RF power amplifier, comprising:
    a first field effect transistor:
        having a first gate, a first source, and a first drain,
        having an output power rating of at least 200 watts, and
        operating with a drain-to-source voltage that is greater than 50 VDC;
    a second field effect transistor:
        having a second gate, a second source, and a second drain,
        having an output power rating of at least 200 watts, and
        operating with a drain-to-source voltage that is greater than 50 VDC;
        wherein said transistors are configured as a push-pull amplifier;
    an RF signal input;
    an input transformer connected to the RF signal input, the input transformer having respective balanced outputs connected to the first gate and the second gate; and
    a broadband output transformer having a first balanced input connected to the first drain, and a second balanced input connected to the second drain, wherein the broadband output transformer has an input to output impedance ratio of 1:4, and further wherein at least some flux cancellation occurs within the broadband output transformer.

2. The RF power amplifier of claim 1, wherein the push-pull amplifier includes a third field effect transistor and a fourth field effect transistor.

3. The RF power amplifier of claim 1, wherein the respective output power ratings of the transistors are at least 300 watts.

4. The RF power amplifier of claim 1, wherein the respective output power ratings of the transistors are at least 750 watts.

5. The RF power amplifier of claim 1, wherein the broadband output transformer is a transmission line transformer including a conductor having a characteristic impedance of approximately or exactly 25 ohms.

6. A modular RF power amplifier system, comprising:
    a first amplifier module comprising the RF power amplifier as set forth in claim 1; and
    a second amplifier module comprising the RF power amplifier as set forth in claim 1;
    wherein outputs from said modules are combined to form a combined RF output.

7. A modular RF power amplifier system, comprising:
    a first amplifier module comprising the RF power amplifier as set forth in claim 1;
    a second amplifier module comprising the RF power amplifier as set forth in claim 1; and
    a third amplifier module comprising the RF power amplifier as set forth in claim 1; wherein outputs from said modules are combined to form a combined RF output.

8. A modular RF power amplifier system, comprising:
    a first amplifier module comprising the RF power amplifier as set forth in claim 1;
    a second amplifier module comprising the RF power amplifier as set forth in claim 1;
    a third amplifier module comprising the RF power amplifier as set forth in claim 1; and
    a fourth amplifier module comprising the RF power amplifier as set forth in claim 1, wherein outputs from said modules are combined to form a combined RF output.

9. The RF power amplifier of claim 1, further comprising:
    an RF output terminal;
    an output balun transformer; and
    a DC-blocking capacitor, wherein the output balun transformer and the DC-blocking capacitor are connected in series between the broadband output transformer and the RF output terminal, and
    wherein the broadband output transformer has balanced outputs, and further wherein, during operation of the RF power amplifier, a net within the broadband output transformer is substantially zero.

10. The RF power amplifier of claim 9, wherein the output balun transformer is directly connected to the RF output terminal.

11. The RF power amplifier of claim 10, further comprising a printed circuit board having a ground plane, wherein
    the transistors, the input transformer, the broadband output transformer, the DC-blocking capacitor, the output balun transformer, and the RF output terminal are attached to the printed circuit board, and further wherein
    the RF output terminal is mounted to the ground plane.

12. The RF power amplifier of claim 11, wherein the respective output power ratings of the transistors are at least 300 watts.

13. The RF power amplifier of claim 11, wherein the respective output power ratings of the transistors are at least 750 watts.

14. The RF power amplifier of claim 11, wherein
the broadband output transformer is a transmission line transformer including a cable having a characteristic impedance of approximately or exactly 25 ohms, and further wherein
the output balun transformer has an input to output impedance ratio of 1:1 and a characteristic impedance of approximately or exactly 50 ohms.

15. A modular RF power amplifier system, comprising:
a first amplifier module comprising the RF power amplifier as set forth in claim 14; and
a second amplifier module comprising the RF power amplifier as set forth in claim 14, wherein outputs from said modules are combined to form a combined RF output.

16. A modular RF power amplifier system, comprising:
a first amplifier module comprising the RF power amplifier as set forth in claim 14;
a second amplifier module comprising the RF power amplifier as set forth in claim 14;
a third amplifier module comprising the RF power amplifier as set forth in claim 14; and
a fourth amplifier module comprising the RF power amplifier as set forth in claim 14, wherein outputs from said modules are combined to form a combined RF output.

17. The RF power amplifier of claim 11, wherein
the respective output power ratings of the transistors are at least 300 watts, and wherein
the broadband output transformer is a transmission line transformer including a conductor having a characteristic impedance of approximately or exactly 25 ohms, and wherein
the output balun transformer has an input to output impedance ratio of 1:1 and a characteristic impedance of approximately or exactly 50 ohms.

18. A modular RF power amplifier system, comprising:
a first amplifier module comprising the RF power amplifier as set forth in claim 17; and
a second amplifier module comprising the RF power amplifier as set forth in claim 17, wherein outputs from said modules are combined to form a combined RF output.

19. A modular RF power amplifier system, comprising:
a first amplifier module comprising the RF power amplifier as set forth in claim 17;
a second amplifier module comprising the RF power amplifier as set forth in claim 17;
a third amplifier module comprising the RF power amplifier as set forth in claim 17; and
a fourth amplifier module comprising the RF power amplifier as set forth in claim 17, wherein outputs from said modules are combined to form a combined RF output.

20. The RF power amplifier of claim 1, wherein coils of the broadband output transformer are parallel-connected at an input of the broadband output transformer and series-connected at an output of the broadband output transformer.

21. An RF power amplifier, comprising:
a first plurality of field effect transistors having directly interconnected drains and respective output power ratings of at least 100 watts;
a second plurality of field effect transistors having directly interconnected drains and respective output power ratings of at least 100 watts;
wherein said transistors operate with a drain-to-source voltage that is greater than 50 VDC, and
wherein the first plurality of field effect transistors and the second plurality of field effect transistors together form a push-pull amplifier having an output power rating of at least 400 watts;
an RF signal input;
an input transformer connected to the RF signal input, the input transformer having respective balanced outputs connected to gates of the first plurality of field effect transistors and gates of the second plurality of field effect transistors; and
a broadband output transformer having a first balanced input connected to the drains of the first plurality of field effect transistors, and a second balanced input connected to the drains of the second plurality of field effect transistors, wherein the broadband output transformer has an input to output impedance ratio of 1:4, and further wherein at least some flux cancellation occurs within the broadband output transformer.

22. The RF power amplifier of claim 21, wherein the respective output power ratings of the transistors are at least 150 watts.

23. The RF power amplifier of claim 21, wherein the respective output power ratings of the transistors are at least 300 watts.

24. The RF power amplifier of claim 21, wherein the broadband output transformer is a transmission line transformer including a conductor having a characteristic impedance of approximately or exactly 25 ohms.

25. A modular RF power amplifier system, comprising:
a first amplifier module comprising the RF power amplifier as set forth in claim 21; and
a second amplifier module comprising the RF power amplifier as set forth in claim 21, wherein outputs from said modules are combined to form a combined RF output.

26. A modular RF power amplifier system, comprising:
a first amplifier module comprising the RF power amplifier as set forth in claim 21;
a second amplifier module comprising the RF power amplifier as set forth in claim 21; and
a third amplifier module comprising the RF power amplifier as set forth in claim 21, wherein outputs from said modules are combined to form a combined RF output.

27. A modular RF power amplifier system, comprising:
a first amplifier module comprising the RF power amplifier as set forth in claim 21;
a second amplifier module comprising the RF power amplifier as set forth in claim 21;
a third amplifier module comprising the RF power amplifier as set forth in claim 21; and
a fourth amplifier module comprising the RF power amplifier as set forth in claim 21, wherein outputs from said modules are combined to form a combined RF output.

28. The RF power amplifier of claim 21, further comprising:
an RF output terminal;
an output balun transformer; and
a DC-blocking capacitor, wherein the output balun transformer and the DC-blocking capacitor are connected in series between the broadband output transformer and the RF output terminal, and
wherein the broadband output transformer has balanced outputs, and further wherein during operation of the RF power amplifier, a net flux within the broadband outputs transformer is substantially zero.

29. The RF power amplifier of claim 28, wherein the output balun transformer is directly connected to the RF output terminal.

30. The RF power amplifier of claim 29, further comprising a printed circuit board having a ground plane,
wherein the transistors, the input transformer, the broadband output transformer, the DC-blocking capacitor, the output balun transformer, and the RF output terminal are attached to the printed circuit board, and
wherein the RF output terminal is mounted to the ground plane.

31. The RF power amplifier of claim 30, wherein the respective output power ratings of the transistors are at least 150 watts.

32. The RF power amplifier of claim 30, wherein the respective output power ratings of the transistors are at least 300 watts.

33. The RF power amplifier of claim 30, wherein
the broadband output transformer is a transmission line transformer including a cable having a characteristic impedance of approximately or exactly 25 ohms, and further wherein
the output balun transformer has an input to output impedance ratio of 1:1 and a characteristic impedance of approximately or exactly 50 ohms.

34. A modular RF power amplifier system, comprising:
a first amplifier module comprising the RF power amplifier as set forth in claim 33; and
a second amplifier module comprising the RF power amplifier as set forth in claim 33, wherein outputs from said modules are combined to form a combined RF output.

35. A modular RF power amplifier system, comprising:
a first amplifier module comprising the RF power amplifier as set forth in claim 33;
a second amplifier module comprising the RF power amplifier as set forth in claim 33;
a third amplifier module comprising the RF power amplifier as set forth in claim 33; and
a fourth amplifier module comprising the RF power amplifier as set forth in claim 33, wherein outputs from said modules are combined to form a combined RF output.

36. The RF power amplifier of claim 30, wherein
the respective output power ratings of the transistors are at least 150 watts, and wherein
the broadband output transformer is a transmission line transformer including a conductor having a characteristic impedance of approximately or exactly 25 ohms, and wherein
the output balun transformer has an input to output impedance ratio of 1:1 and a characteristic impedance of approximately or exactly 50 ohms.

37. A modular RF power amplifier system, comprising:
a first amplifier module comprising the RF power amplifier as set forth in claim 36; and
a second amplifier module comprising the RF power amplifier as set forth in claim 36, wherein outputs from said modules are combined to form a combined RF output.

38. A modular RF power amplifier system, comprising:
a first amplifier module comprising the RF power amplifier as set forth in claim 36;
a second amplifier module comprising the RF power amplifier as set forth in claim 36;
a third amplifier module comprising the RF power amplifier as set forth in claim 36; and
a fourth amplifier module comprising the RF power amplifier as set forth in claim 36, wherein outputs from said modules are combined to form a combined RF output.

39. The RE power amplifier of claim 21, wherein coils of the broadband output transformer are parallel-connected at an input of the broadband output transformer and series-connected at an output of the broadband output transformer.

* * * * *

UNITED STATES PATENT AND TRADEMARK OFFICE
CERTIFICATE OF CORRECTION

| | | |
|---|---|---|
| PATENT NO. | : 7,683,718 B2 | Page 1 of 1 |
| APPLICATION NO. | : 11/749786 | |
| DATED | : March 23, 2010 | |
| INVENTOR(S) | : Dishop | |

It is certified that error appears in the above-identified patent and that said Letters Patent is hereby corrected as shown below:

In the specification, column 3, line 61, change "Ti" to -- T1 --

In the specification, column 8, line 42, change "06" to -- Q6 --

In the claims, column 10, line 2, change "includes" to -- further comprises --

In the claims, column 10, line 49, add the word -- flux -- after the word "net" and before the word "within"

In the claims, column 12, line 63, change "outputs" to -- output --

In the claims, column 14, line 31, change "RE" to -- RF --

Signed and Sealed this
Eighteenth Day of January, 2011

David J. Kappos
*Director of the United States Patent and Trademark Office*